(12) United States Patent
Chou et al.

(10) Patent No.: US 11,837,509 B1
(45) Date of Patent: Dec. 5, 2023

(54) METHOD OF MANUFACTURING AND PACKAGING SILICON PHOTONICS INTEGRATED CIRCUIT DIES IN WAFER FORM

(71) Applicant: INPHI CORPORATION, Santa Clara, CA (US)

(72) Inventors: Hsu-Feng Chou, Westlake Village, CA (US); Keith Nellis, Westlake Village, CA (US); Loi Nguyen, Westlake Village, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 419 days.

(21) Appl. No.: 16/920,069

(22) Filed: Jul. 2, 2020

(51) Int. Cl.
| | |
|---|---|
| *H01L 31/02* | (2006.01) |
| *H01L 21/66* | (2006.01) |
| *G02B 6/13* | (2006.01) |
| *G01M 11/00* | (2006.01) |
| *H01L 31/0232* | (2014.01) |
| *H01L 31/18* | (2006.01) |

(52) U.S. Cl.
CPC ............ *H01L 22/10* (2013.01); *G01M 11/30* (2013.01); *G02B 6/13* (2013.01); *H01L 31/02325* (2013.01); *H01L 31/1808* (2013.01)

(58) Field of Classification Search
CPC .......... G02B 6/13; G01M 11/30; H01L 22/10; H01L 31/02325; H01L 31/1808
See application file for complete search history.

(56) References Cited

U.S. PATENT DOCUMENTS

| | | | |
|---|---|---|---|
| 6,590,644 B1* | 7/2003 | Coin | G01M 11/332 398/16 |
| 6,697,750 B1* | 2/2004 | Coin | H04B 10/07 702/123 |
| 8,885,157 B2* | 11/2014 | Masuda | G01R 31/2886 324/501 |
| 8,907,696 B2* | 12/2014 | Masuda | G01R 31/31917 324/762.01 |
| 9,236,958 B2* | 1/2016 | Stone | G01J 1/42 |
| 9,612,401 B2* | 4/2017 | Frankel | G02B 6/4206 |
| 9,746,608 B1* | 8/2017 | Rabiei | G03F 7/0005 |
| 9,960,888 B2* | 5/2018 | Gloeckner | H04B 10/40 |
| 10,180,373 B2* | 1/2019 | Grosse | G02B 6/34 |
| 10,488,605 B1* | 11/2019 | Budd | G02B 6/4296 |
| 10,551,577 B2* | 2/2020 | Seyedi | G02B 6/124 |
| 11,022,522 B2* | 6/2021 | Piazza | G01M 11/0207 |

(Continued)

*Primary Examiner* — Eduardo A Rodela (57) ABSTRACT

A method of packaging the silicon photonics wafer for fabricating custom optical-electrical modules includes fabricating a wafer with multiple dies of silicon photonics circuits based on custom design and conducting electrical and optical tests of the silicon photonics circuits in wafer level. The method further includes preparing the wafer for next point of use. Additionally, the method includes performing post-wafer processing on the wafer received at the next point of use. The method further includes conducting post-process electrical tests of the silicon photonics circuits in wafer level. Furthermore, the method includes preparing the wafer with known-good-dies or a known-good-wafer identified for custom use. Moreover, the method includes performing custom process on the know good dies.

9 Claims, 6 Drawing Sheets

(56) References Cited

U.S. PATENT DOCUMENTS

| | | | |
|---|---|---|---|
| 2013/0209026 A1* | 8/2013 | Doany | G02B 6/32 438/32 |
| 2016/0161333 A1* | 6/2016 | Stone | G01J 1/42 250/208.1 |
| 2017/0160482 A1* | 6/2017 | Frankel | G02B 6/4214 |

* cited by examiner

METHOD OF MANUFACTURING AND PACKAGING SILICON PHOTONICS INTEGRATED CIRCUIT DIES IN WAFER FORM

BACKGROUND OF THE INVENTION

The present invention relates to silicon photonics wafer-die fabrication techniques. More particularly, the present invention provides a method of manufacturing and packaging silicon photonics integrated circuit dies product in wafer form, including but not limiting to silicon-photonics wafer-processing, wafer-level testing, wafer packaging, post-wafer processing, custom die-bonding, die-level testing, and module assembling.

As science and technology are updated rapidly, processing speed and capacity of the computer increase correspondingly. The communication transmission or reception using the traditional cable is limited to bandwidth and transmission speed of the traditional cable and mass information transmission required in modern life causes the traditional communication transmission overload. To correspond to such requirement, the optical fiber transmission system replaces the traditional communication transmission system gradually. The optical fiber communication is chosen for systems requiring higher bandwidth and longer distance that electrical cable cannot accommodate. Present electronic industrial performs research toward optical transmission which will become the mainstream in the future even for short distance communication. Said optical communication is a technology in that light wave functions as signal carrier and transmitted between two nodes via the optical fiber. An optical communication system includes an optical transmitter and an optical receiver. By the optical transceiver, the received optical signal can be converted to an electrical signal capable of being processed by an IC, or the processed electrical signal can be converted to the optical signal to be transmitted via optical fiber. Therefore, objective of communication can be achieved.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band WDM (Wavelength Division Multiplexed) optical transmission over existing single-mode fiber is a target for the next generation of fiber-optic communication networks. More recently, optical components are being integrated on silicon (Si) substrates for fabricating large-scale silicon photonics integrated circuits that co-exist with micro-electronic chips. Chip-scale lasers packaged directly within silicon photonics opto-electrical system have been of interest for many applications such as wide-band DWDM or CWDM communication and wavelength-steered light detection. A whole range of photonic components, including filters, (de)multiplexers, splitters, modulators, and photodetectors, have been demonstrated, mostly in the silicon-on-insulator (SOI) platform. The SOI platform is especially suited for standard DWDM communication bands around 1550 nm or CWDM communication band around 1310 nm, as silicon (n=3.48) and its oxide $SiO_2$ (n=1.44) are both transparent, and form high-index contrast, high-confinement waveguides ideally suited for medium to high-integration planar integrated circuits (PICs).

With the advances of silicon photonics technology and high-speed data communication applications driven by the market, the demands become stronger on increasing bandwidth for optical communication and decreasing package footprint of an optical transceiver. It is more and more challenging to integrate all necessary components within smaller and smaller silicon photonics chips and process and test these chips in wafer level. For example, optical transceiver in PIC chip may integrate active or passive components like laser chips, modulator drivers, transimpedance amplifiers (TIAs), photo detectors, and optional PLC photonics blocks on a same silicon photonics substrate. However, manufacture of such silicon photonics chips for on-board optics product faces many challenges in many aspects such as wafer processing on combinations of electrical die and photonics die, optical/electrical testing in wafer level, and wafer packaging for customer, module assembly and testing.

BRIEF SUMMARY OF THE INVENTION

The present invention relates to silicon photonics techniques. More particularly, the present invention provides a method for manufacturing and packaging wafer product based on silicon photonics platform, including but not limiting to wafer-processing, wafer-level testing, packaging, shipping, die-level testing, and module assembling. Merely by example, the method is applied for fabricating, testing, and packaging an optical transceiver from wafer, die, chip, to module, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 3 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides a method of method of packaging the silicon photonics wafer for fabricating custom optical-electrical modules. The method includes fabricating a wafer with multiple dies of silicon photonics circuits based on custom design. Additionally, the method includes conducting electrical and optical tests of the silicon photonics circuits in wafer level to identify known-good-wafer. The method further includes preparing the known-good-wafer for next point of use. Furthermore, the method includes performing post-wafer processing on the known-good-wafer received at the next point of use. The method further includes conducting post-process electrical tests of the silicon photonics circuits in wafer level. Moreover, the method includes preparing the known-good-wafer identified for custom use and performing custom process on the known-good-wafer.

In a specific embodiment, the present invention provides a method of making optical-electrical modules based on silicon photonics chips supplied in wafer form. The method includes designing a silicon photonics integrated circuit rooted from a silicon photonics wafer process and performing the silicon photonics wafer process on array of bare dies in a silicon-on-insulator wafer to fabricate the silicon photonics integrated circuit per die. The method further includes packaging the array of bare dies in a known-good-wafer via a post-wafer process to transform a silicon photonics chip per die with multiple mounting contact pads and one or more chip sites containing array of bumps enabled to bond one or more flip-chips. Additionally, the method includes flip-bonding one or more functional chips to the one or more chip sites. The method further includes performing wafer-level tests on the silicon photonics chip including the one or more functional chips at least in known-good-dies of the known-good-wafer. Furthermore, the method includes dicing each of the known-good-dies out of the known-good-wafer to pick up the silicon photonics chip and bonding the silicon photonics chip via the multiple mounting contact pads to a module unit on printed circuit board assembly. The method further includes aligning fiber arrays actively for light coupling in or out of the module unit on printed circuit board assembly. Moreover, the method includes packaging the module unit on printed circuit board assembly.

The present invention achieves these benefits and others in the context of known waveguide laser modulation technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to silicon photonics techniques. More particularly, the present invention provides a method for manufacturing and packaging wafer product based on silicon photonics platform, including but not limiting to wafer-processing, wafer-level testing, packaging, shipping, die-level testing, and module assembling. Merely by example, the method is applied for fabricating, testing, and packaging an optical transceiver from wafer, die, chip, to module, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

In an aspect, the present disclosure provides a method of fabricating a silicon photonics wafer with a plurality of dies of silicon photonics integrated circuits for making optical-electrical module. As data transmission-capacities increase in WDM systems, demand on high-speed, high-bandwidth, low-loss optical transceiver based on silicon photonics platform increasingly attract more and more interest over the recent years. A under the silicon photonics platform, optical-electrical module is preferred to be fabricated by assembling various optical and electrical functional chip dies together on board, including particular silicon photonics die with passive or active photonics devices with novel structural/performance designs integrated into a silicon-based wafer. Optical-electrical modules assembled with the silicon photonics integrated circuit dies provides high performance in compact package, showing great potential in advanced data communication applications. Optionally, the silicon photonics integrated circuit (SPIC) can be manufactured in full wafer process including packaging and shipping in wafer form before being diced and applied for assembling custom optical-electrical module.

Figure 1:
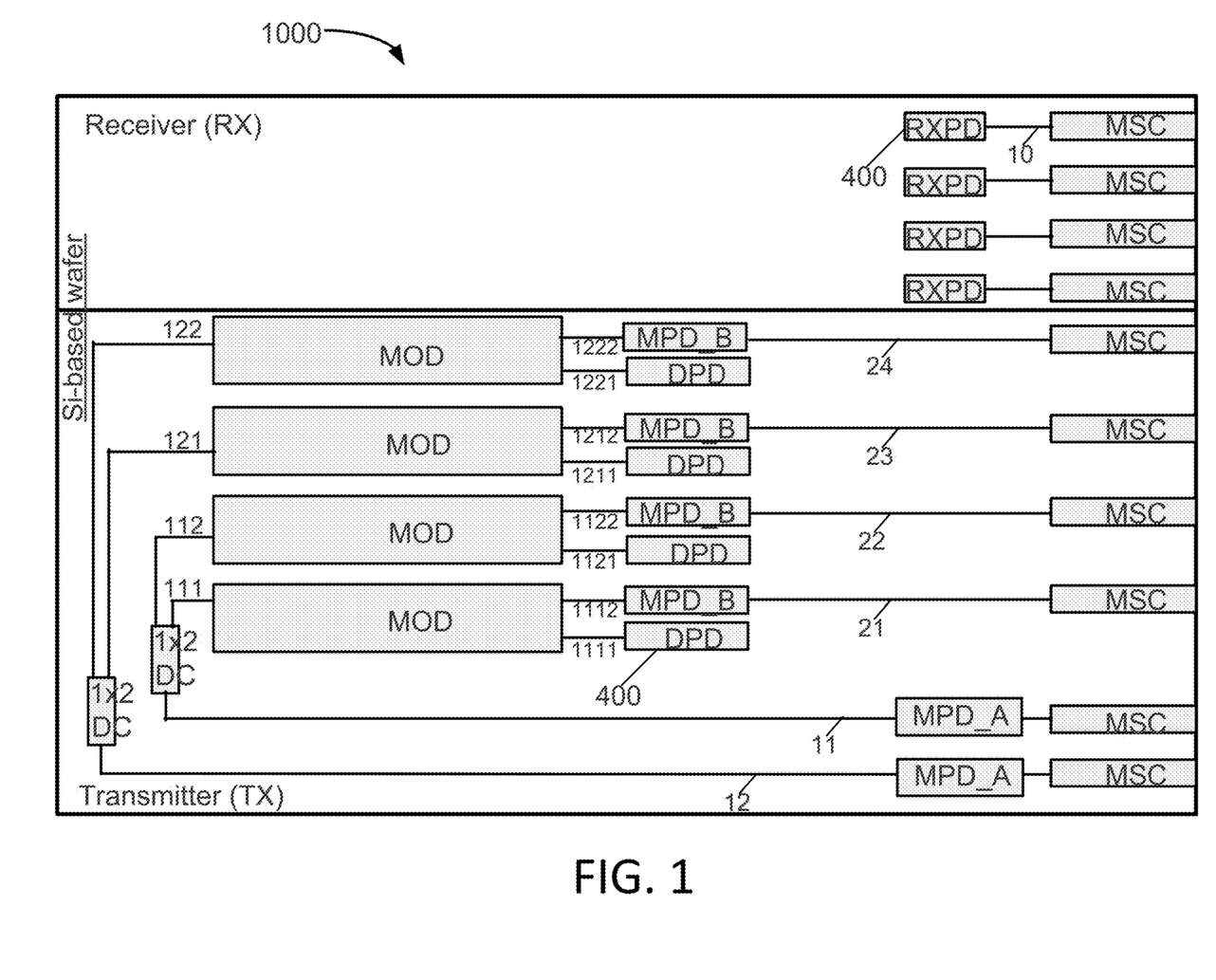
FIG. 1 is a simplified block diagram of a silicon photonics integrated circuit as one die on a silicon photonics wafer for fabricating an optical transceiver module according to an embodiment of the present invention.

In an embodiment, manufacture, package, and sell of a bare SPIC die for producing a multi-channel single-wavelength optical transceiver module is presented below. Merely as an example, a compact optical transceiver based on the novel SPIC chip with the advantages of high-speed, low power consumption, and low cost can support 100 Gbps and 400 Gbps data center interconnection application and beyond. FIG. 1 is a simplified block diagram of a silicon photonics integrated circuit on a Silicon-based wafer for forming an optical transceiver chip according to an embodiment of the present invention. This diagram is merely an example, which should not unduly limit the scope of the claims. One of ordinary skill in the art would recognize many variations, alternatives, and modifications. In an embodiment, as shown in FIG. 1, a silicon photonics integrated photonics circuit 1000 is schematically illustrated in a block diagram, which is formed as a bare die in a silicon-based wafer. In the embodiment, the silicon photonics integrated photonics circuit (SPIC) 1000 is configured to form an optical transceiver module. Accordingly, the bare die of the SPIC contains a layout of a Receiver (RX) sub-circuit with multiple RX-input ports and a Transmitter (TX) sub-circuit with one or more light sources and multiple TX-output ports. Optionally, the optical transceiver is a 4-channel single wavelength optical transceiver configured to receive four incoming light signals and transmit four output light signals. Optionally, the bare die of SPIC is 5.9 mm×4.9 mm. Optionally, the bare die of SPIC is processed and sold in wafer form. Optionally, the bare die of SPIC can be upgraded to 8-channel optical transceiver supporting 800 Gbit/s.

Referring to FIG. 1, the RX sub-circuit of the SPIC 1000 is formed in the silicon-based wafer substrate. The RX sub-circuit includes multiple RX-input ports each having a mode size converter (MSC) configured to receive an incoming light signal into one of multiple waveguides 10 and multiple RX photo detectors (RXPD) coupled respectively to the multiple waveguides 10. In the embodiment, the incoming light signals are usually delivered via optical fibers (e.g., from a data center). Optionally, the RX-sub-circuit accepts four parallel optical inputs at the edge of the bare die. In order to involve the SPIC into the optical fiber communication system with low coupling loss, a mode size converter MSC is needed in order to solve issues of mode mismatch between the optical fiber and the SPIC. The MSC is a passive photonics device that is wholly formed within the silicon-based wafer substrate. More details will be presented later. Optionally, the silicon-based wafer substrate for forming the MSC includes at least a silicon layer, a cladding layer made by an insulator, and a silicon nitride layer embedded in the cladding layer. Optionally, the silicon-based wafer also contains a Germanium layer. Optionally, the RXPD is provided as a Germanium-based high-speed photodiode 400. One RXPD is coupled in each path of the multiple waveguides 10 to receive one incoming light signal and is able to convert the optical signal to an electrical signal to be processed by a digital signal processor through a transimpedance amplifier module, provided an optical transceiver is formed based on the SPIC 1000. Optionally, the bare die consists of pad openings for a flip-chip transimpedance amplifier (TIA) that is required to be assembled in the optical transceiver module. The TIA produces four electrical signals at output pads of the bare die that can drive the subsequent digital signal processing.

Referring to FIG. 1, the TX sub-circuit of the SPIC 1000 is also formed in the same silicon-based wafer substrate. The TX sub-circuit includes two or more TX-input ports with edge-coupled coarse wavelength light sources (at 1311 nm±6.5 nm). Each port is coupled to a mode size converter (MSC) and a first TX monitoring photo detector (MPD_A) into one input waveguide 11 (or 12) for monitoring optical power of light signals received by the TX-input ports thereof. The TX sub-circuit further includes two or more 1×2 directional couplers (1×2 DC) each coupled between the input waveguide 11 (12) and two mod-input waveguides 111, 112 (or 121, 122) to separate each light source to two lightpaths. Additionally, the TX sub-circuit includes four lanes of Mach-Zehnder modulators (MZM-MOD) coupled between respective multiple mod-input waveguides (e.g., 111) and multiple mod-output waveguides (e.g., 1111, 1112). Each MOD receives one traveling light wave from one lightpath with one of two mod-output waveguide 1112 being coupled to a second TX monitoring photo detector (MPD_B) for monitoring optical power of modulated light signals outputted by the MOD thereof. The MOD on-chip matched termination resistors are driven by a modulator driver, which could be an external driver or a flip-chip on the die. Another one of the two mod-output waveguide 1111 is directly coupled to a photo detector (DPD). Optionally, the DPD is provided as a Germanium-based high-speed photodiode 400, similar to that for the RXPD. Furthermore, the TX sub-circuit includes multiple TX-output ports each having a mode size converter (MSC) coupled to respective one of the multiple output waveguides (e.g., 21, 22, 23, 24).

In the embodiment, each TX-input port is configured through the mode size converter (MSC) thereof to receive a laser light signal monitored by the first TX monitoring photo detector (MPD_A). Typically, the laser light is delivered via fiber from a laser device disposed separately from the SPIC 1000 so that MSC is also implemented here for mode matching of the light signal between the SPIC and fiber. Optionally, the MSC used here can be substantially the same as one used for RX input ports. In the embodiment, each 1×2 DC is configured to split the laser light signal to two input light signals. Optionally, the 1×2 DC is a 50/50 splitter so that one laser light from a laser device can be split equally in power providing two input light signals for two channels of the SPIC 1000. Each modulator (MOD) is configured to modulate one input light signal to generate one modulated output light signal to carry communication data stream in one mod-output waveguide (e.g., 1112). The output light signal is monitored by the second TX monitoring photo detector (MPD_B) and outputted to respective one of the multiple output waveguides (e.g., 21). Each TX-output port is configured through the MSC thereof to output the output light signal to a fiber leading to a data center or network. Optionally, each of the waveguides (e.g., 10) in the RX sub-circuit, the input waveguide (e.g., 11), the mod-input waveguide (e.g., 111), the mod-output waveguide (e.g., 1111), and the output waveguide (e.g., 21) in the TX sub-circuit is formed in the silicon-based wafer from the silicon nitride layer to achieve lower optical loss.

Figure 2:
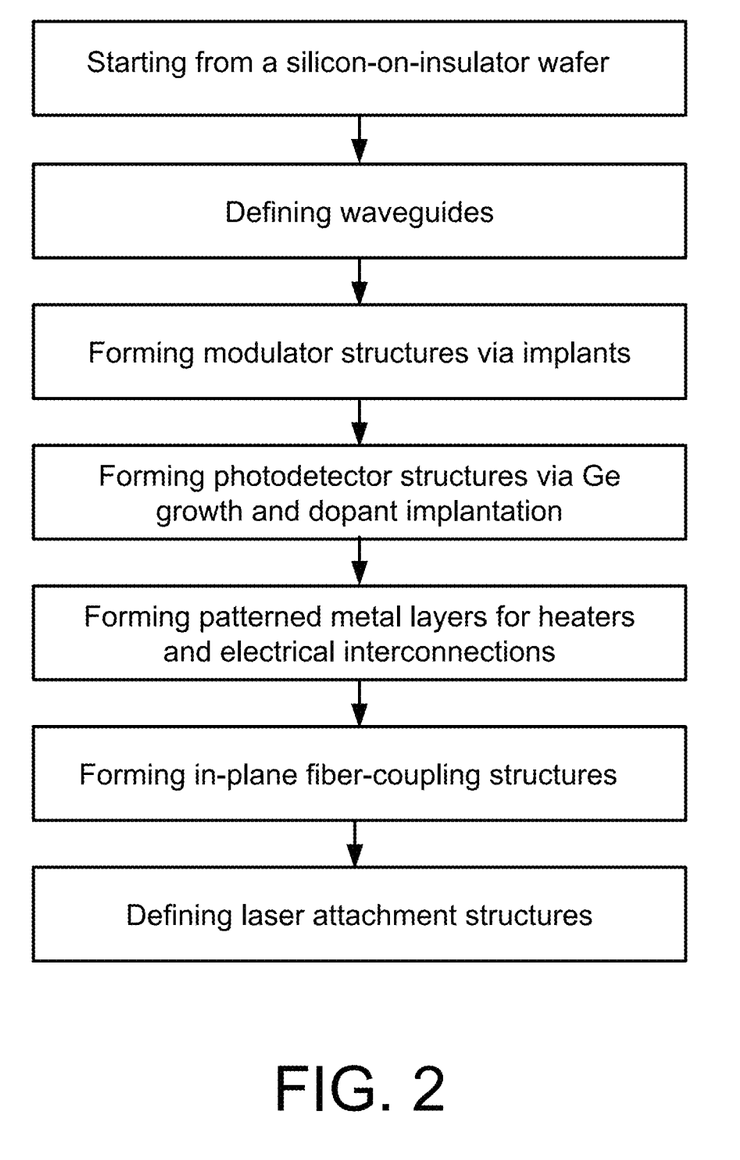
FIG. 2 is a flow chart illustrating a method of fabricating a silicon photonics wafer according to an embodiment of the present invention.

FIG. 2 is a flow chart illustrating a method of fabricating a silicon photonics wafer according to an embodiment of the present invention. This diagram is merely an example, which should not unduly limit the scope of the claims. One of ordinary skill in the art would recognize many variations, alternatives, and modifications. Referring to FIG. 2, the method of fabricating a silicon photonics wafer is summarized in the flow of steps, though many steps can be executed in different order, some steps may be replaced, and some steps may be added. The method includes a step of starting (the process) from a silicon-on-insulator (SOI) wafer. Optionally, the SOI wafer is provided as a 220 nm silicon layer on 3 μm insulator BOX layer. The method further includes a step of defining waveguides in the SOI wafer. Optionally, the step includes lithography process to define waveguide pattern. Optionally, the step includes etch process including BARC etch, Oxide etch, Si etch, followed by photoresist cleaning and wafer cleaning. Optionally, the step further includes defining primary Si waveguides within the Si layer on the SOI wafer, depositing secondary waveguide materials such as SiN or SiON, and defining the secondary waveguides on or embedded in the SOI wafer.

Referring to FIG. 2, the method also includes a step of forming modulator structures via implants. Optionally, the step involves making active devices on the bare die. For forming the modulator structure, hardmask strip and sacrificial oxide deposition using PECVD to deposit 10 nm $SiO_2$ are performed. The method further includes a step of forming photodetector structures. In particular for the bare die of SPIC 1000, the step involves Ge epitaxy growth and dopant implantation to form high-speed Ge photodiode for 400G or 800G applications. Optionally, the step includes many processes like lithography, photoresist striping, wafer cleaning, implantation, dopant activation, cladding oxide deposition, etching, chemical-mechanical plantation (CMP).

Referring to FIG. 2, the method additionally includes a step of forming patterned metal layers for heaters and electrical interconnections in the SOI wafer. Optionally, the step includes forming contact via openings using lithography and dry etching techniques. Optionally, the step includes HF wet cleaning process, deposition and definition of interconnect layers, metallization process to fill TaN/Al/TaN into the contact vias and interconnect layers. Optionally, the step may include forming SiN layer using etch-stop-layer etching process, performing metal etching, photoresist striping, and wafer cleaning. Optionally, the step also includes deposition of intermediate insulator layer for isolating the metal interconnect layers. For example, PECVD deposition of 120 nm oxide layer is performed. Additionally, the step includes lithography, CMP reverse etch (dry etch), optionally, high-density plasma oxide deposition, oxide CMP. The step results in formation of one or more heaters (for modulator tuning). Optionally, the step may include another round of forming patterned metal layers for additional electrical interconnections on top of the previous metal interconnection layers. Optionally, the step ends with forming an oxide passivation layer and preparing surface of the oxide layer.

Referring to FIG. 2, the method furthermore includes a step of forming in-plane fiber-coupling structures on the bare die of SPIC. Optionally, the step includes forming a suspended coupler involving processes of lithography, V-groove definition, oxide etching, $SiO_2$/SiN mask formation and etching, wet anisotropic Si etching, photoresist striping, and wafer cleaning. The V-groove structure plus the suspended coupler is a preferred in-plane edge coupling structure for coupling optical fiber to the silicon waveguide at the edge of the bare die. Moreover, the method includes a step of defining laser attachment structures. The step includes defining mounting site for the laser chip, forming stoppers, contact electrodes, and alignment pins. The emission exit of the laser chip, as the laser chip is flip-bonding to the defined mounting site, should be aligned properly to the TX-input port which is coupled to the Si waveguide in the bare die of SPIC 1000.

Figure 3:
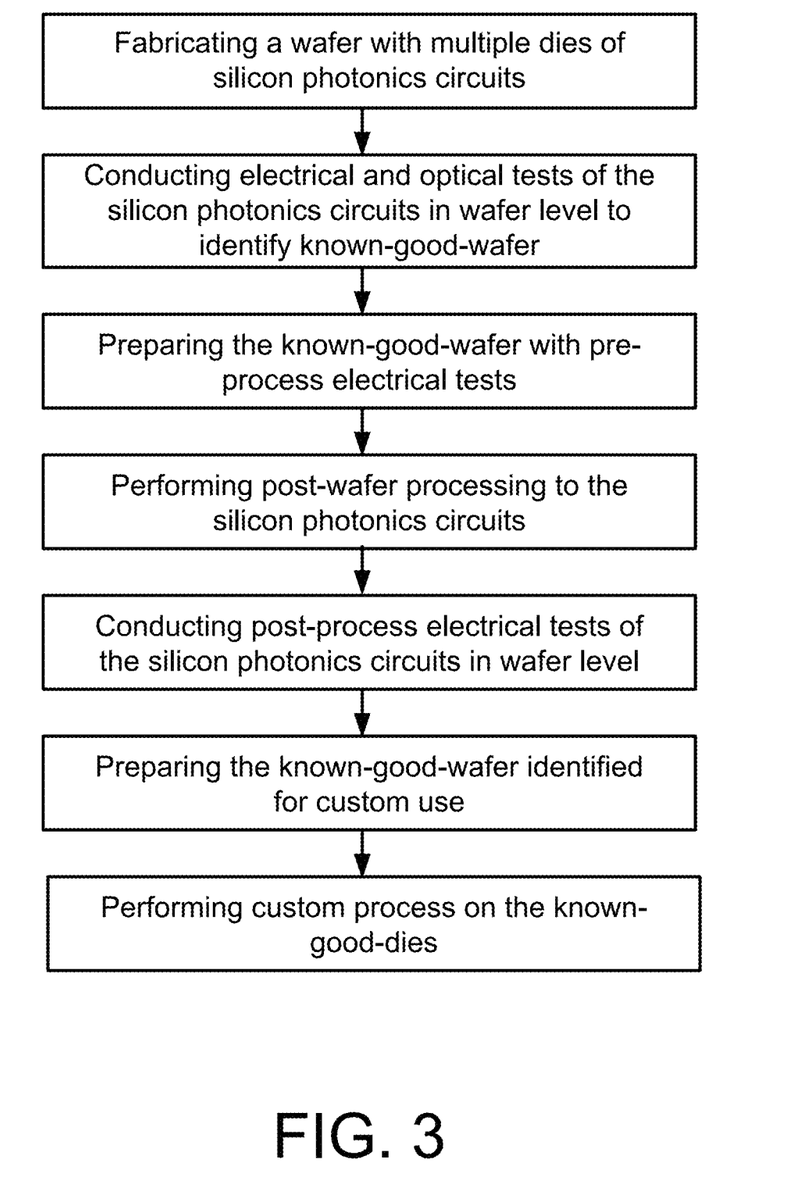
FIG. 3 is a flow chart illustrating a method of packaging the silicon photonics wafer of FIG. 2 for fabricating optical-electrical modules according to an embodiment of the present invention.

FIG. 3 is a flow chart illustrating a method of packaging the silicon photonics wafer of FIG. 2 for fabricating optical-electrical modules according to an embodiment of the present invention. This diagram is merely an example, which should not unduly limit the scope of the claims. One of ordinary skill in the art would recognize many variations, alternatives, and modifications. Referring to FIG. 3, the method includes a step of fabricating a wafer with multiple dies of silicon photonics circuits. Optionally, this step is substantially the method described in the flow chart of FIG. 2, in which a plurality of silicon photonics integrated circuit (SPIC) dies is formed on a silicon-on-insulator (SOI) wafer as a substrate. Optionally, the silicon-on-insulator wafer is an 8-inch wafer. Optionally, the whole method of FIG. 2 is namely a silicon photonics (SiPho) process based on and beyond simple CMOS infrastructure and processing techniques wherein Ge is also grown to make high-speed photodiodes, for example, used as a components in each die for making a 4-channel single wavelength optical transceiver module. Optionally, the SPIC die includes several distinctive photonics devices on the wafer, such as passive devices like waveguides, couplers, and splitters, and active devices like MZ modulators, photodetectors, grating couplers. Optionally, some grating couplers are formed for performing wafer-level optical testing under a pre-defined or custom tester with process control monitors. Optionally, some grating couplers are formed along dicing lines where the individual SPIC die is cut off the wafer for subsequent module assembly. Optionally, this step, or the whole SiPho process, is executed in one contract manufacturer.

Referring to FIG. 3, the method of packaging the silicon photonics wafer for fabricating optical-electrical modules further includes a step of conducting electrical and optical tests of the silicon photonics integrated circuits in wafer level to identify known-good-wafer. Optionally, this step is conducted on sampled reticles in a wafer without need to identify every good die therein. Optionally, this step is conducting 100% electrical and optical tests of product dies in wafer to identify known-good-wafer with known-good-dies among all production wafers. Optionally, this step is performed in a percentage of all production wafers to identify known-good-wafer based on a predetermined criterion. Optionally, the wafer level testing is conducted on a probe station with process control monitors to engage with pre-defined electrical contact pads and optical input/output ports on the wafer for respective one or more SPIC dies. For passive devices in the SPIC die, the optical transmission spectrum and optical responsivity can be measured in a selected wavelength band (for example, O-band for the SPIC 1000 for making a 4-channel single wavelength optical transceiver module). For active devices in the SPIC die, electrical and electro-optical parameters can be measured. For example, capacitance, resistance, dark current, I-V characteristics can be measured at DC condition or detector and modulator bandwidth at RF frequencies. Additionally, optical calibration and repeatability measurement are also monitored. Optionally, the known-good-wafer does not require all known-good-dies being identified. Optionally, this step is also executed in the contract manufacturing site for quality control as a procedure of wafer acceptance test. This step identifies known-good-wafers based on a predetermined criterion set for a qualified (good) wafer. The criterion may include a percentage of sampled wafer quantity, selections of measurement types, specifications for the selected optical/electrical parameters per die, a percentage of known-good-dies.

Referring to FIG. 3 again, the method of packaging the silicon photonics wafer for fabricating optical-electrical modules additionally includes a step of preparing the known-good-wafer with pre-process electrical tests. Optionally, this step includes additional testing on selected test dies inside a reticle specified by chip-designer (such as Inphi Corp, Santa Clara, CA). Measurements on diode responsivity, extinction ratio and even halfwave voltage of the modulator MZ-MOD, optical insertion loss of the TX path can be taken. Optionally, these additional tests are included in a wafer acceptance test for a next manufacturer who is ready for performing post-wafer processes on all SPIC dies in the wafer form. Optionally, the step includes packaging each (accepted) known-good-wafer in a wafer shipper box and shipping the wafer to next point of use. Optionally, the known-good-wafer in this packaging process does not have every known-good-dies being identified. the packaging is finished within a microclean facility to keep the fabricated wafer with the bare SPIC dies substantially free of contaminants after the SiPho process and various wafer-level testing. Optionally, various procedures of reducing particles, preventing ESD, reducing outgassing are included in the packaging and shipping process.

Referring further to FIG. 3, the method of packaging the silicon photonics wafer for fabricating optical-electrical modules includes a step of performing post-wafer processing to the silicon photonics circuits in SPIC dies in wafer form. Optionally, this step is performed on the known-good-wafer identified. This step, in the example of processing the die of SPIC 1000, includes at least some processes of under-bump metallization (UBM) for forming chip-sites form bonding TIA or driver flip-chips, deep etching for optical waveguides, formation of multiple pad openings for forming electrical contact pads of the bare die itself. Optionally, on top of the UBMs for bonding TIA, a metal plating process is carried to form a Cu pillars for a bump of ~50 μm in size including ~25 μm-Cu at bottom on the UBM, 3 μm-Ni in the middle, and 22 μm-SnAg solder alloy on top. Optionally, a reflow process (maybe a re-reflow process) is followed to make the bump to substantially hemisphere shape. Optionally, the reflow process is performed in a rapid thermal process oven (RTP) under $N_2$ atmosphere. Some reflow processes utilize ECR-RIE and low-pressure MOCVD. Optionally, an array of these bumps is formed in a pre-determined chip site of the SPIC die and is enabled to bond a TIA flip-chip or a driver flip-chip thereon. Optionally, another array of these bumps is formed in another chip site of the SPIC die designated for flip-mounting a driver chip thereon. A minimum bump pitch distance of these arrays of bumps is about 100 μm. Additionally, the metal plating process also includes plating a CuNiAu alloy into the pad openings to form electrical contact pads enabled to mount the SPIC die itself as a silicon photonics chip to a module substrate used for on-board assembly of an optical-electrical module unit.

Optionally, the step, for some other silicon photonics integrated circuit dies for making more complicated optical modules, may include many other post-wafer processes. For example, for a die to be used for making a multi-channel multi-wavelength optical transceiver for extra-short-reach interconnect data communication, the step may include carrier wafer bonding, trans-substrate-via formation to allow electrical connection between the first metal layer of the wafer frontside and its backside, Cu redistribution layer formation for a passive interposer on the silicon photonics die, conductor bump formation, and contact pads formation, etc. in addition to the listed processes above for the dies of SPIC 1000 in the wafer form. Optionally, some virtual connection lines and probing pads that are solely used for testing may be formed during the same process step of metallization process. Optionally, the locations of these virtual connection lines and probing pads may be in the boundary regions between dies or in the dicing lanes and can be discarded after dicing the wafer to obtain individual known-good-dies of silicon photonics integrated circuits.

Referring to FIG. 3 again, the method of packaging the silicon photonics wafer for fabricating optical-electrical modules further includes a step of conducting post-process electrical tests of the silicon photonics circuits in wafer level. Optionally, this step may include conducting 100% electrical test on every die of the wafer in development stage. Optionally, this step may include testing on limited quantity of sampled dies in the known-good-wafer in normal production wafer sale. Optionally, the post-process electrical tests in the step include measuring leakage current of MZ modulator (MZ-MOD), resistance of termination, dark current of photodetectors of the limited quantity of dies as process control monitor procedure or wafer-acceptance test requirement.

Moreover, the method includes preparing the known-good-wafer identified for custom use. Optionally, this step includes performing 100% tests to the wafer to identify known-good-dies in the wafer or performing sampled tests to identify known-good-wafer. Optionally, this step includes summarizing wafer-level acceptance test data and post-process electrical test data to determine known-good-dies in the wafer. The step further includes packing the known-good-wafer into a wafer shipper box and shipping it to the next point of use as one step of fabricating, packaging, and selling the silicon photonics integrated circuits in wafer form to a customer. Optionally, the packaged wafer to be shipped is a known-good-wafer for custom use without known-good-dies being identified. Optionally, this packaged wafer for custom use is shipped directly to a designated customer manufacturing facility or factory for making custom-designed optical-electrical module. Optionally, the wafer received by the customer manufacturing facility or factory is subjected to custom-designed testing to further identify the known-good-dies in the known-good-wafer. Finally, the method includes performing custom process on the known-good-dies in wafer level as well as in individual chip level. Each known-good-die is diced out of the known-good-wafer to be used as an individual SPIC chip for making the custom optical-electrical module. Optionally, the method includes an incoming quality control process for the wafer received by the customer.

Figure 4:
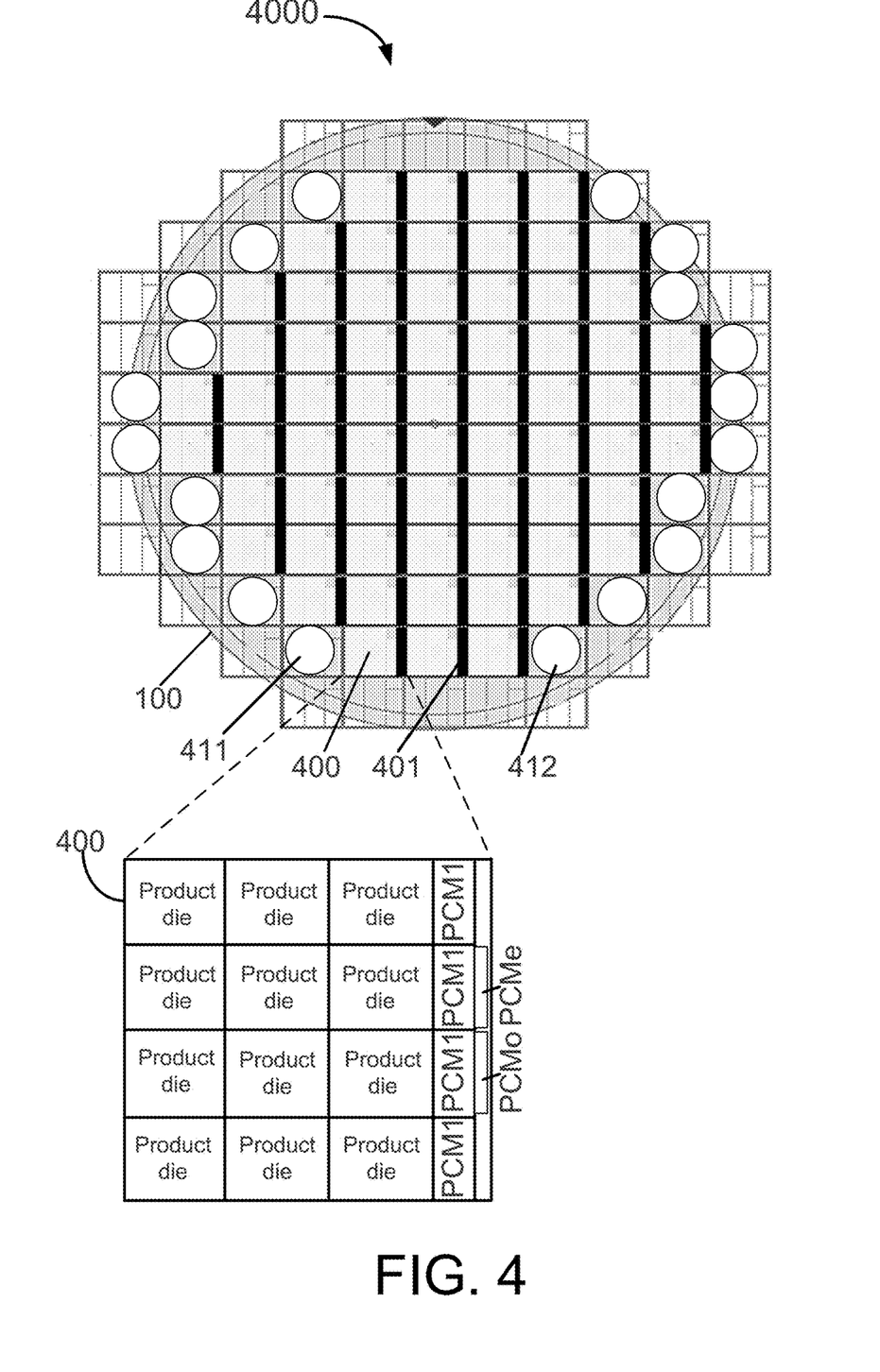
FIG. 4 is a schematic top view of wafer layout with process control monitors located on edges of a silicon photonics wafer for wafer-level testing according to an embodiment of the present invention.

FIG. 4 is a schematic top view of wafer layout with process control monitors located on edges of a silicon photonics wafer for wafer-level testing according to an embodiment of the present invention. This diagram is merely an example, which should not unduly limit the scope of the claims. One of ordinary skill in the art would recognize many variations, alternatives, and modifications. Referring to FIG. 4, a wafer layout 4000 of a plurality of integrated photonics circuits is provided with multiple reticles 400 arranged in rows and columns across substantially a whole area of a silicon photonics wafer 100. Each reticle 400 may include multiple product dies of silicon photonics integrated circuits (SPICs) as shown in expanded view of one reticle 400. Optionally, each product die in the reticle 400 includes at least a subset of the SPIC 1000 of FIG. 1. The wafer layout 4000 further includes multiple process control monitors (PCM) 401 disposed at least at one edge of each reticle 400. Optionally, the PCM associated with each reticle 400 includes a first PCM (PCM1) provided by circuit designer of the SPIC chip for testing at least one row of product dies in the reticle 400. Optionally, the PCM associated with each reticle 400 also includes a second PCM (PCMe) for conducting electrical test for all product dies in the reticle 400. Optionally, the PCM associated with each reticle 400 also includes a third PCM (PCMo) for conducting optical test for all product dies in the reticle 400. Optionally, the second PCM and the third PCM are provided at a different stage of wafer fabrication. In an example, the PCMe and PCMo are fabricated in a silicon photonics (SiPho) process customized for the circuit designer of the product die in each reticle.

In an alternative embodiment, ear edges the wafer 100. Optionally, alternate electrical contacts for certain product dies are formed on the edges of the wafer to power up a row of devices virtually connected serially and can be disconnected after dicing. Each row of reticles shares at least two probing pads 411 and 412 respectively located at two end regions of the row of reticles 400 near the edge of the wafer 100. The probing pads 411 or 412, including both optical probing ports or couplers to allow input/output of optical test signals and electrical probing ports for applying bias voltage or drive current etc. Optionally, the probing pads 411 and 412 can be formed during the fabrication process of the silicon photonics wafer. For example, the probing pads 411 and 412 can be formed at a same process for forming a metallization layer and the optical grating coupler can be formed during the formation of waveguide in the silicon photonics wafer. As a bias current from tester is applied to the corresponding electrical contacts associated with the two probing pads 411 and 412 for testing some active devices in a row of dies within the row of reticles 400, the electrical contacts may be configured to allow the electrical connection through the series of active devices be in a serial connection so that the bias current is flowing through to each active device in series. Thus, a single probing bias current can be used to test the series of active devices in a whole row of dies. Similarly, as all the probing pads of the whole wafer layout 4000 are employed, the wafer-level testing for all dies in the wafer 100 can be performed.

Figure 5:
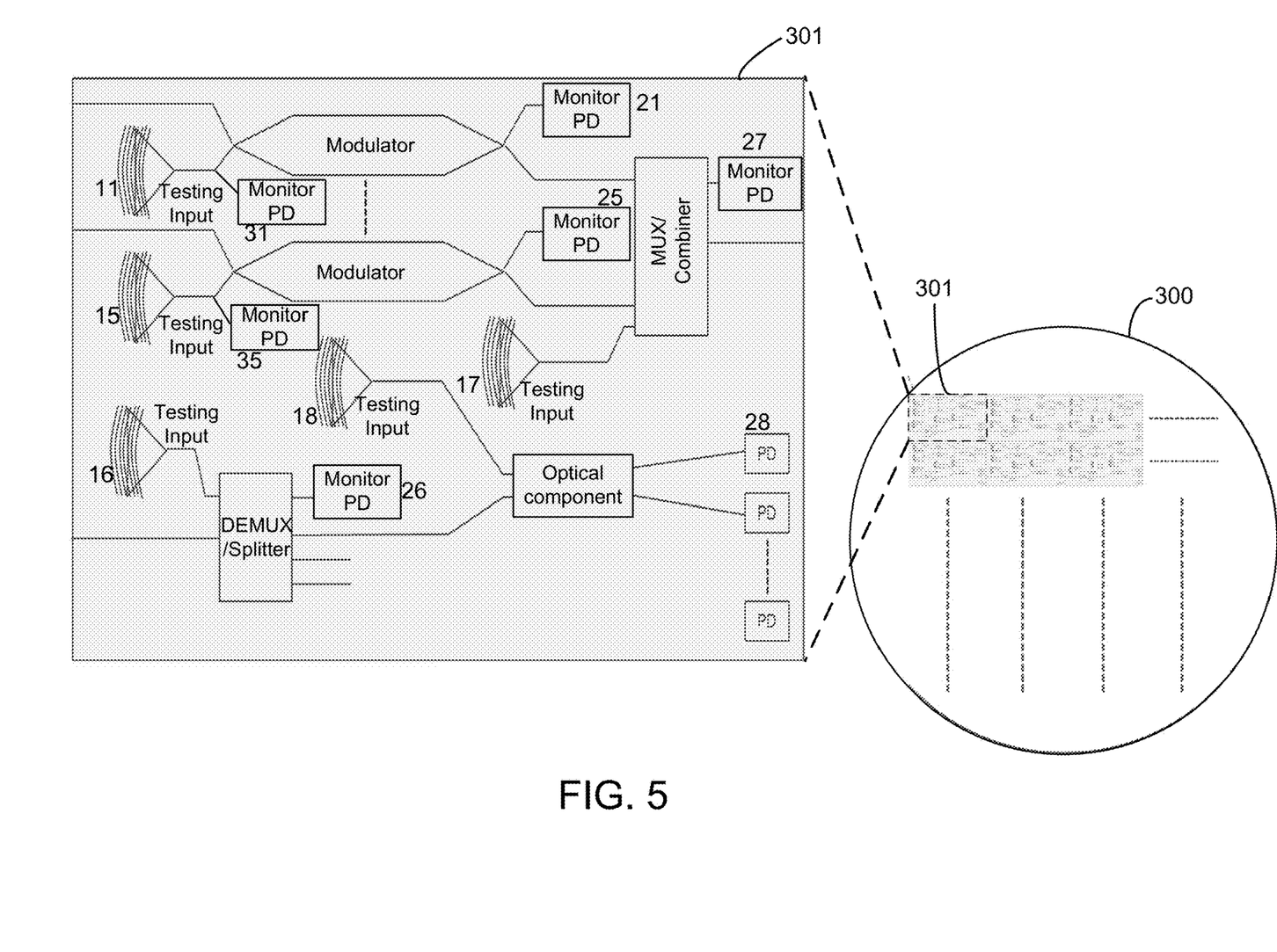
FIG. 5 shows a simplified probing layout for performing wafer-level testing on each die of silicon photonics integrated circuits according to some embodiments of the present invention.

FIG. 5 shows a simplified probing layout for performing wafer-level testing on each die of silicon photonics integrated circuits according to some embodiments of the present invention. This diagram is merely an example, which should not unduly limit the scope of the claims. One of ordinary skill in the art would recognize many variations, alternatives, and modifications. As shown, a silicon photonics wafer 300 is fabricated with a plurality of dies arranged in columns and rows. Each die is a silicon photonics integrated circuit 301. A simplified version of the silicon photonics integrated circuit 301 is shown in an expanded view, including at least several modulators, a Mux/combiner component, a DeMux/splitter component, and a functional optical component. In addition to those essential optical devices of the silicon photonics integrated circuit 301, several surface grating couplers (11, . . . , 15) respectively to couple with the several modulators of the SPIC are added to provide extra testing inputs. Optionally, several monitor PDs (21, . . . , 25) are added respectively at extra output ports of the several modulators to detect corresponding current signals. Optionally, several other monitor PDs (31, . . . , 35) are added respectively at testing input ports for measuring the propagation loss of respective modulators. Based on the measurements, the coupling loss of the testing inputs can be calibrated.

Optionally, another surface grating coupler 16 is added to couple with the DeMux/splitter component to provide a testing input and a corresponding monitor PD 26 is added to detect testing current signal. Additionally, a surface grating coupler 17 is added to couple with the Mux/combiner component to provide a testing input and a monitor PD 27 is added to detect a current signal in association with the testing input. Similarly, a surface grating coupler 18 is formed for supplying a testing input to the functional optical component which has a plurality of built-in PDs for detecting multiple current signals in association with at least the testing input. In general, integrating grating couplers and monitor PDs to the SPIC dies in wafer form is easier and less expensive than integrating light source thereon, it is advantageously to couple light from a fiber-based light source through the grating couplers into each corresponding components of the SPIC die, which enables a whole wafer-level testing on 100% dies or flexibly a partial wafer-level testing on selected dies on the wafer.

In yet another aspect, the present disclosure provides a method of supplying silicon photonics integrated circuit dies in wafer form for assembling optical-electrical modules. In one embodiment, the silicon photonics integrated circuit (SPIC) is provided as one of a plurality of bare dies in a silicon photonics wafer. The silicon photonics wafer is fabricated via a silicon photonics (SiPho) process based on a silicon-on-insulator wafer and is packaged via various post-wafer processes to form array of bumps on each bare die as flip-chip mounting sites and form multiple contact pads for mounting each bare die as a chip by itself. Optionally, the SiPho process for fabricating the silicon photonics wafer is performed in a contract manufacturer. Optionally, the post-wafer processes on the silicon photonics integrated circuit dies are performed on a known-good-wafer without identifying known-good-dies supplied from the previous contract manufacturer in a next contract manufacturer. The silicon photonics integrated circuit in each bare die in the known-good-wafer can be fully tested optically and electrically in wafer level to identify all known-good-dies thereof. Each of the known-good-dies contains a silicon photonics (SiPho) chip of silicon photonics integrated circuit to be supplied in wafer form.

Figure 6:
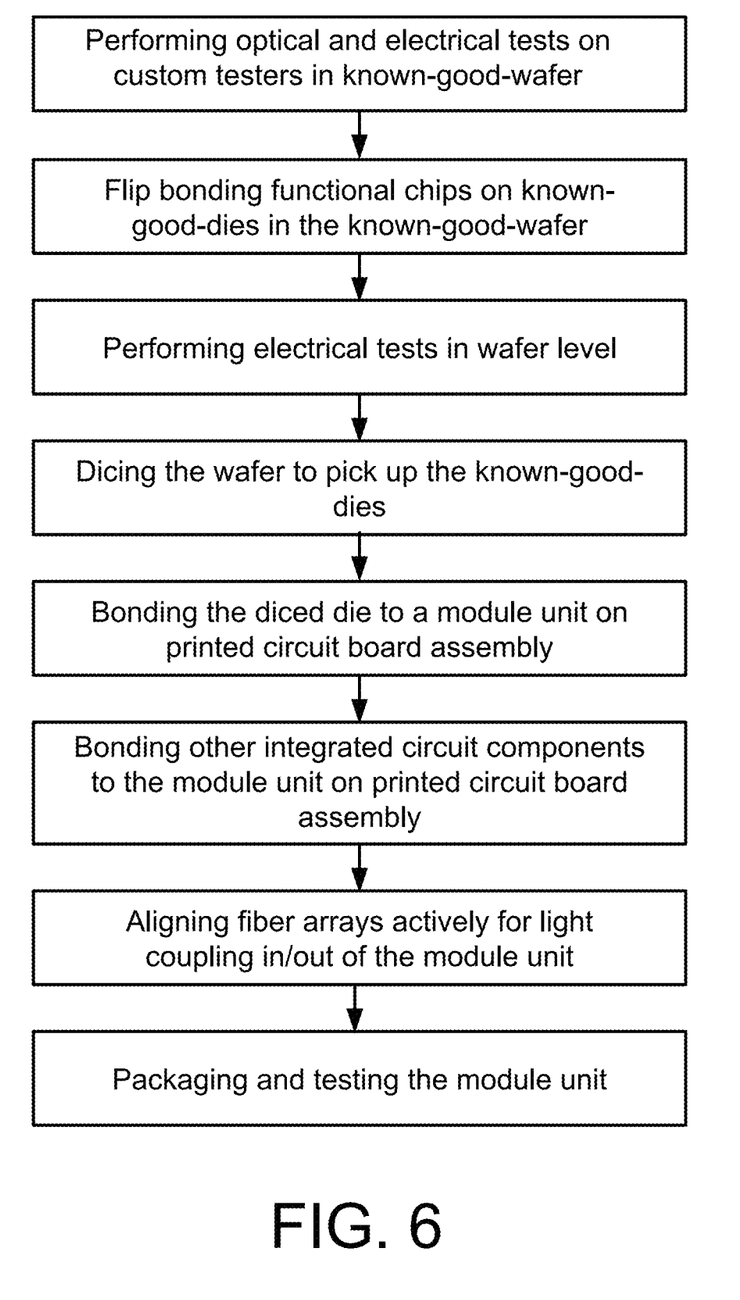
FIG. 6 is a flow chart illustrating a method of fabricating an optical-electrical module based on silicon photonics chip provided in wafer form according to an embodiment of the present invention.

FIG. 6 is a flow chart illustrating a method of fabricating an optical-electrical module based on a silicon photonics chip provided in wafer form according to an embodiment of the present invention. This diagram is merely an example, which should not unduly limit the scope of the claims. One of ordinary skill in the art would recognize many variations, alternatives, and modifications. Referring to FIG. 6, the method firstly includes a step of performing optical and electrical tests in wafer level on custom testers to optionally test all silicon photonics integrated circuits provided in wafer form. As described in the method of packaging the silicon photonics wafer in FIG. 3, each silicon photonics integrated circuit is fabricated as one die in the wafer. The wafer being sampled or 100% tested can be identified as a known-good-wafer. The known-good-wafer or a wafer with multiple known-good-dies identified is supplied in a wafer shipper box. The step as mentioned is optionally an incoming quality control process for accepting the silicon photonics integrated circuit dies in wafer form by a user or customer intended to make an optical-electrical module based on the silicon photonics integrated circuit. Optionally, the wafer has been designed, fabricated, and packaged according to specifications of the user or customer which include various process control monitors or probing contact pads formed in the wafer compatible with the custom testers used in the optical/electrical tests for this step. Optionally, the wafer level testing is leveraged from the pre-added grating coupler structures coupled to each modulator in each die of the wafer to conduct optical-in/electrical-out test for each SPIC 1000 per die. See example of using the added grating couplers and monitor PDs to conduct the wafer-level testing to each die of the wafer shown in FIG. 5.

Referring to FIG. 6, the method of fabricating an optical-electrical module based on silicon photonics chip provided in the known-good-wafer also includes identifying known-good-dies in the wafer. The method then includes a step of flip bonding functional chips respectively on the SPICs in the known-good-dies in the wafer. The functional chips are varied depending on different types and designs of the optical-electrical module to be assembled. In an example, for making a 4-channel single wavelength optical transceiver module based on the SPIC 1000 (FIG. 1), a transimpedance amplifier (TIA) chip is flip-bonded on a pre-determined chip site in the die. The same module also needs a modulator driver for driving each MZ modulator in the SPIC 1000. Thus, a modulator driver chip is also flip-bonded to a pre-determined chip site in die. Optionally, the step may be executed to those pre-determined known-good-dies only which can be confirmed during the incoming quality control process. In another example, for making in-packaged optical engine comprising 8-channel 4-wavelength optical transceiver module, 4 laser chips may be needed to be directly mounted to pre-defined chip sites with respectively aligned waveguide splitters on a corresponding die of SPIC. The SPIC 1000 is designed to couple with (two) external laser chips as light sources for transmitting the 4-channel single wavelength signals. No chip sites for lasers are designed in the dies sold in wafer form. Of course, many variations, modifications, and alternatives can be possible with new functional chips being added for meeting new designs of the optical-electrical module for various opto-electrical communication applications.

Referring to FIG. 6 again, the method of fabricating an optical-electrical module based on silicon photonics chip provided in wafer form further includes a step of performing electrical tests in wafer level. As the functional chips, mostly for controlling or driving active devices in the SPIC, electrical tests for the chip-mounted dies would be important. Optionally, the step is to test directly the responsivity of the SPIC after TIA chip bonding. Optionally, the step is to test each modulator's responsivity of the SPIC after the modulator driver chip bonding. Optionally, the known-good-dies after the flip-bonding of functional chips are re-determined after a wafer-level sub-assembly of the SPIC and functional chips (TIA and/or driver). Optionally, the electrical test may include a wafer-level test of the modulator in the die via a grating coupler input for optical-in/electrical-out testing purpose. Followed by the step, the method of fabricating an optical-electrical module based on silicon photonics chip provided in wafer form additionally includes a step of dicing the known-good-wafer to pick up the wafer-level sub-assembly of the SPIC and functional chips in each known-good-die. After the dicing, those virtual connection lines and probing pads may be discarded and the known-good-die of sub-assembly of the SPIC and functional chips is obtained in a chip form.

Referring to FIG. 6, furthermore, the method of fabricating an optical-electrical module based on silicon photonics chip provided in wafer form includes a step of bonding the diced die to a module unit on a printed circuit board assembly. Optionally, the printed circuit board is a module substrate that supports the module unit and configured to connect to external devices (such as power supply, data center, gear box or retimer, network interfaces). The diced die is a chip by itself with corresponding electrical contact pads being formed during the post-wafer processes in the method of packaging the silicon photonics wafer. Optionally, diced die is mechanically aligned to allow the corresponding electrical contact pads to bond directly to pre-determined bonding sites on the printed circuit board or through an interposer pad. Optionally, the diced die is optically aligned with external planar light circuits formed on glass substrate or edge coupled with external light sources. Optionally, the module unit needs more than one diced die on the same printed circuit board assembly. Additionally, the method of fabricating an optical-electrical module based on silicon photonics chip provided in wafer form includes a step of bonding other integrated circuit components to the module unit on printed circuit board assembly. The other integrated circuit components include custom-made driver chip, SLC capacitors, resistors, detectors etc., or even laser chips. Optionally, the SPIC chip for making 4-channel single wavelength optical transceiver module accepts two edge coupled coarse wavelength lasers (for example, the wavelength is selected in a range of 1311 nm±6.5 nm) at its optical inputs. Optionally, the step includes doing wire bonding to connect the driver chip to the SPIC die and connect the SPIC die to the printed circuit board.

Referring to FIG. 6 again, moreover, the method of fabricating an optical-electrical module based on silicon photonics chip provided in wafer form includes a step of aligning fiber array actively for light coupling in/out of the sub-assembly of the SPIC die plus the TIA chip or driver chip. Optionally, the SPIC chip for making 4-channel single wavelength optical transceiver module accepts two edge coupled coarse wavelength lasers (for example, the wavelength is selected in a range of 1311 nm±6.5 nm) at its optical inputs. The input light is coupled to a splitter to become two branches, each being led to a modulator and driven electrically by the driver chip to modulate the light input to product modulated signals. Optionally, the SPIC chip for making 4-channel single wavelength optical transceiver module accepts four parallel optical inputs from incoming optical fibers and 4 optical outputs to deliver four modulated light signals. All the input/output ports are formed at the edge of the bare die. A suspended coupler plus a V-groove structure may be formed for facilitating optical alignment between each of the input or output ports at the edge region of the bare die and an optical fiber. Optionally, the optical fibers that are edge coupled with the in/out ports of the SPIC die are provided as arrays of SMF fibers. Optionally, the optical fiber arrays are firstly coupled to a planar light waveguide in an external glass substrate before coupled with the SPIC circuit in the die. Optionally, the external glass substrate is mounted on the printed circuit board next to the SPIC chip with TIA and driver bonded. Finally, method of fabricating an optical-electrical module based on silicon photonics chip provided in wafer form includes a step of packaging the module unit assembled on the printed circuit board assembly. Optionally, the step of packaging includes sealing module unit in a module case or mounting into a network system chassis with other network gear box. Optionally, the module testing can be individually or systematically within the network system chassis.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A silicon photonics integrated circuit comprising:
a plurality of optical devices, ones of the optical devices including inputs and outputs configured for use during normal operation and additionally including test inputs and test outputs configured for use during testing;
optical couplers coupled to the test inputs of the optical devices, the optical couplers configured to couple optical test signals to the test inputs during the testing of the optical devices to test optical characteristics of the optical devices, wherein the optical characteristics of the optical devices comprise one or more of temporal, magnitude, and frequency characteristics of signals at one or more of the inputs and outputs of the optical devices; and
photodetectors coupled to the test outputs of the optical devices, the photodetectors configured to detect output signals at the test outputs, the output signals including responses of the optical devices to the optical test signals during the testing of the optical devices, the output signals being indicative of the optical characteristics of the optical devices.

2. The silicon photonics integrated circuit of claim 1 wherein the optical couplers are configured to couple light from a fiber-based light source into the test inputs of the optical devices during the testing of the optical devices.

3. The silicon photonics integrated circuit of claim 1 further comprising additional photodetectors coupled to the test inputs of the optical devices to test additional optical characteristics of the optical devices during the testing of the optical devices.

4. The silicon photonics integrated circuit of claim 1 wherein the optical couplers and the photodetectors are unused during the normal operation of the optical devices.

5. The silicon photonics integrated circuit of claim 1 wherein the optical couplers and the photodetectors are not connected to the inputs and outputs used during the normal operation of the optical devices.

6. The silicon photonics integrated circuit of claim 1 wherein the optical devices comprise optical modulators, optical combiners, and optical splitters and wherein the optical couplers comprise grating couplers.

7. The silicon photonics integrated circuit of claim 1 wherein the optical devices comprise optical modulators and wherein the optical characteristics include extinction ratios, propagation losses, and bandwidths of the optical modulators.

8. The silicon photonics integrated circuit of claim 1 wherein the optical characteristics include (i) a transmission spectrum and (ii) responsivity of the optical devices in a selected wavelength band.

9. The silicon photonics integrated circuit of claim 1 wherein the optical characteristics include insertion losses of transmit paths associated with the optical devices in the silicon photonics integrated circuit.

* * * * *